(12) United States Patent
Richards et al.

(10) Patent No.: US 7,121,412 B2
(45) Date of Patent: Oct. 17, 2006

(54) HINGED SWING BRACKET ASSEMBLY FOR A RACK SYSTEM

(75) Inventors: Nancy J. Richards, Westerly, RI (US); Marjana M. Abby, Kingston, RI (US); Robert C. Baxter, Warwick, RI (US)

(73) Assignee: Hubbell Incorporated, Orange, CT (US)

( * ) Notice: Subject to any disclaimer, the term of this patent is extended or adjusted under 35 U.S.C. 154(b) by 97 days.

(21) Appl. No.: 10/615,401

(22) Filed: Jul. 9, 2003

(65) Prior Publication Data

US 2005/0006324 A1 Jan. 13, 2005

(51) Int. Cl.
*A47F 7/00* (2006.01)
(52) U.S. Cl. ...................................... 211/26
(58) Field of Classification Search ............ 24/26, 24/18.9, DIG. 1; 248/282.1, 276.1, 206.5, 248/284.1, 289.11; 16/320, 302, 366, 328
See application file for complete search history.

(56) References Cited

U.S. PATENT DOCUMENTS

| | | | | |
|---|---|---|---|---|
| 231,126 A * | 8/1880 | Webb et al. ............. | 248/282.1 |
| 1,054,241 A * | 2/1913 | Richardson et al. ..... | 248/282.1 |
| 1,554,161 A * | 9/1925 | Hubbard ..................... | 16/368 |
| 2,205,484 A * | 6/1940 | Hunter ......................... | 16/350 |
| 3,832,756 A * | 9/1974 | Lew .............................. | 16/297 |
| 4,700,922 A * | 10/1987 | Gross .......................... | 248/558 |
| 4,902,852 A | 2/1990 | Wuertz | |
| 5,187,836 A | 2/1993 | Kim et al. | |
| 5,210,906 A | 5/1993 | Aihara et al. | |
| 5,460,441 A * | 10/1995 | Hastings et al. ............ | 312/298 |
| 5,942,729 A | 8/1999 | Carlson, Jr. et al. | |
| 5,971,509 A | 10/1999 | Deimen et al. | |
| 6,070,742 A | 6/2000 | McAnally et al. | |
| 6,305,556 B1 * | 10/2001 | Mayer ......................... | 211/26 |
| 6,347,714 B1 | 2/2002 | Fournier et al. | |
| 6,489,565 B1 | 12/2002 | Krietzman et al. | |
| 6,523,918 B1 * | 2/2003 | Baiza ....................... | 312/265.1 |
| 6,805,248 B1 * | 10/2004 | Champion et al. ............ | 211/26 |

* cited by examiner

*Primary Examiner*—Sarah Purol
(74) *Attorney, Agent, or Firm*—Marcus R. Mickney; Mark S. Bicks; Alfred N. Goodman

(57) ABSTRACT

A hinged swing bracket assembly for a telecommunications rack system has first, second and third arms. The first arm has a first end and a second end and is adapted to be connected to a support. The second arm has first and second ends. The first end of the second arm is pivotally connected to the first arm and the second end of the second arm is releasably connected to the first end of the first arm. The third arm has first and second ends. The first end of the third arm is pivotally connected to the second end of the second arm, and the second end of the third arm is releasably connected to the first end of the second arm.

14 Claims, 6 Drawing Sheets

HINGED SWING BRACKET ASSEMBLY FOR A RACK SYSTEM

REFERENCE TO RELATED APPLICATION

This application is related to U.S. patent application Ser. No. 11/502,385, entitled Integrated Vertical Cable Management System, all concurrently filed here with in the name of Marjana M. Abby et al. and commonly assigned to Hubbell Incorporated, the subject matter of each of which is hereby incorporated by reference.

FIELD OF THE INVENTION

The present invention relates to a hinged swing bracket assembly. More particularly, the present invention relates to a hinged swing bracket assembly for a telecommunications rack system. Still more particularly, the present invention relates to a hinged swing bracket assembly having first, second and third arms in which the second arm is pivotally and releasably connected to the first arm and the third arm is pivotally and releasably connected to the second arm, thereby providing a cover that is quickly and easily moved to access cabling housed in a channel in the rack system.

BACKGROUND OF THE INVENTION

Data technology is being used to an increasing extent in the communications industry to carry various types of signals and data. In telephone communications, for example, the use of data lines between central offices and individual residential and business subscribers has allowed for large increases in signal traffic and improved signal quality. Telecommunications circuitry is generally housed in telecommunications cabinets placed at or near the subscriber locations, with a single cabinet typically serving a large number of individual subscribers. In telecommunications cabinets, racks or banks of circuits are provided in the form of slide-out circuit boards that are easily removed from the equipment rack when repair or replacement is needed. Due to the large number of circuit boards housed in a telecommunications cabinet, an even greater number of cables, including, but not limited to, fiber optic and copper cables, are also housed in the telecommunications cabinet. The numerous cables tend to interfere with access to the various components and circuit boards housed in the telecommunications cabinet.

Because data cables are often manufactured in standard lengths with connectors already attached at both ends, cables are generally used that are longer than needed when making connections to a circuit board. The excess cable length allows equipment racks and individual circuit boards to be removed and replaced at a different location in the telecommunications cabinet, should this become necessary. However, the excess cable must be stored in some way, which presents problems in the management of a large number of cables housed in conventional telecommunications cabinets. Because data cables can be fragile and cannot be bent or deformed in the same manner that electrical wires can, it is difficult to compactly and efficiently manage the cables.

The excess cables are often allowed to remain exposed at the front of the equipment rack. Unfortunately, the exposed cables obscure the various printed indicia, visual indicators and circuit board extractors usually provided on the front panel of the equipment rack, and occupies valuable space within the cabinet that might otherwise be devoted to other hardware. The presence of the cables within the cabinet also requires that additional space be provided in the interior of the telecommunications cabinet, thereby requiring a somewhat deeper cabinet than might otherwise be desired. The exposed cable is also susceptible to damage from personnel working within the cabinet because of the cables' fragility, and can expose repair personnel to potential eye injury from laser light if a cable becomes inadvertently detached from the connectors on the circuit boards. Finally, the exposed cables, including, but not limited to, fiber optic and copper cables, are aesthetically undesirable, since it creates an unsightly appearance (a "rat's nest" of cables) in the interior of the telecommunications cabinet, which also makes tracking individual cables extremely difficult.

Another problem that occurs with unmanaged cables is that the cables interfere with work done by personnel in the telecommunications cabinet. Personnel often must move cable out of the way in the area in which they are working, thereby subjecting the cable to undesirable bending or flexing. Furthermore, due to the large number of cables within the telecommunications cabinet, personnel often accidentally bump into or move the cables. Due to the fragility of the cables, small degrees of bending or flexing may damage or even break the cables.

Existing telecommunications rack systems often have channels along the sides of the racks in which the cables are run. By using these channels, the above-mentioned problems concerning cable management can be avoided. However, the same cable management issues are now present in those channels. Covers are often attached to the channels to cover the cabling, thereby eliminating the unsightly appearance of the cabling. However, a problem exists because those channel covers are attached in such a manner that the generally requires the covers to be completely removed to access the cabling. Thus, any changes and modifications to the cabling and/or equipment housed in the telecommunications rack system requires the cover to be completely removed from the channels so that the associated cabling can be accessed. Removing the covers to access the cabling is inefficient and requires an excessive amount of time. Other Therefore, a need exists for a bracket assembly that connects the cover to the channel that does not require the cover to be removed to access the channel.

Thus, there is a continuing need to provide improved swing hinged bracket assemblies.

SUMMARY OF THE INVENTION

Accordingly, it is a primary objective of the present invention to provide an improved swing hinged bracket assembly.

A further objective of the present invention is to provide an improved swing hinged bracket assembly for a telecommunications rack system.

A further objective of the present invention is to provide a swing hinged bracket assembly that connects a cover to a support that does not require the cover to be removed to access the cabling.

A still further objective of the present invention is to provide a swing hinged bracket assembly that allows a cover to be quickly and efficiently moved to access cabling housed in a channel.

The foregoing objects are basically attained by providing a hinged swing bracket assembly for a telecommunications rack system. The hinged swing bracket assembly has first, second and third arms. The first arm has a first end and a second end and is adapted to be connected to a support. The second arm has first and second ends. The first end of the second arm is pivotally connected to the first arm and the second end of the second arm is releasably connected to the first end of the first arm. The third arm has first and second ends. The first end of the third arm is pivotally connected to the second end of the second arm, and the second end of the second arm is releasably connected to the first end of the second arm.

Other objects, advantages and salient features of the invention will become apparent from the following detailed description, which, taken in conjunction with the annexed drawings, discloses preferred embodiments of the invention.

BRIEF DESCRIPTION OF THE DRAWINGS

Referring now to the drawings that form a part of the original disclosure.

DESCRIPTION OF THE INVENTION

As shown in FIGS. 1–7, the present invention relates to a hinged swing bracket assembly 11 for a telecommunications rack system 13.

Figure 5:
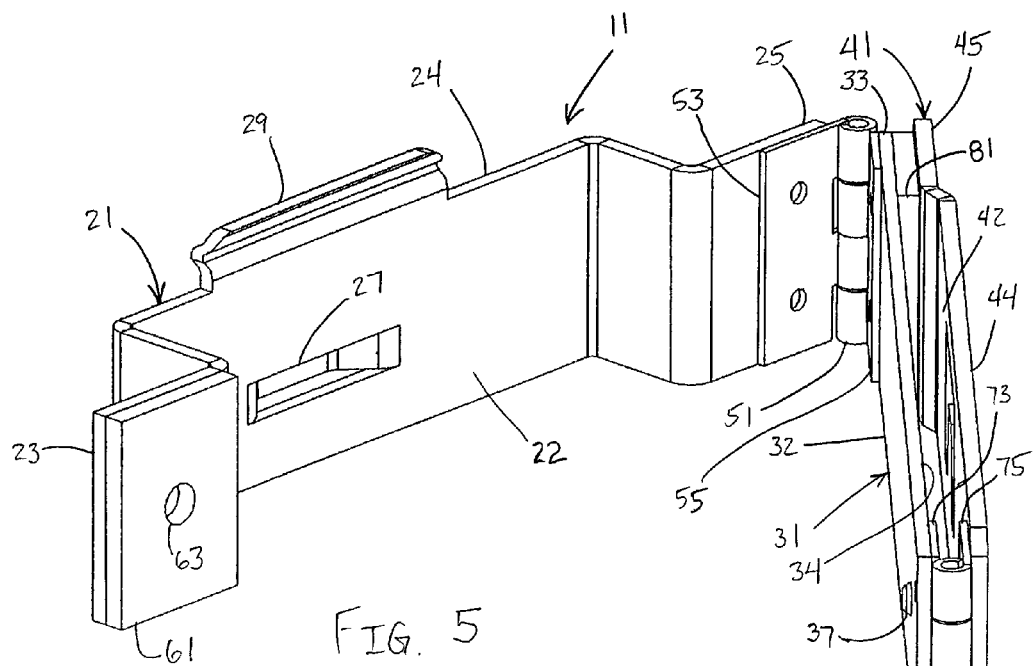
FIG. 5 is a front perspective view of a hinged swing bracket assembly according to the present invention in which the second arm has been pivoted relative to the first arm.
Figure 6:
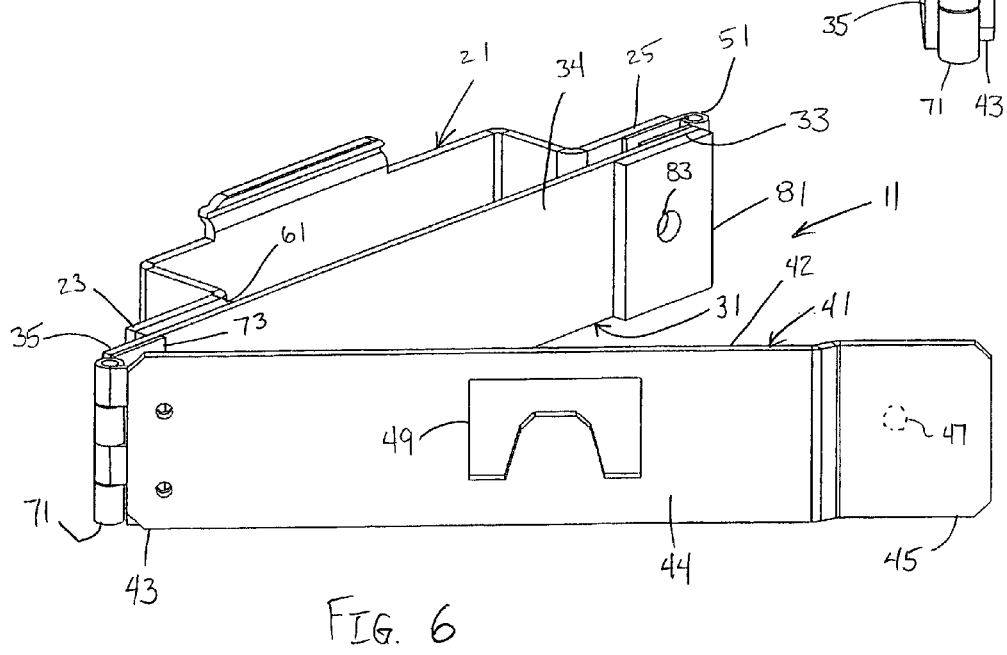
FIG. 6 is a front perspective view of a hinged swing bracket assembly according to the present invention in which the third arm has been pivoted relative to the second arm.
Figure 7:
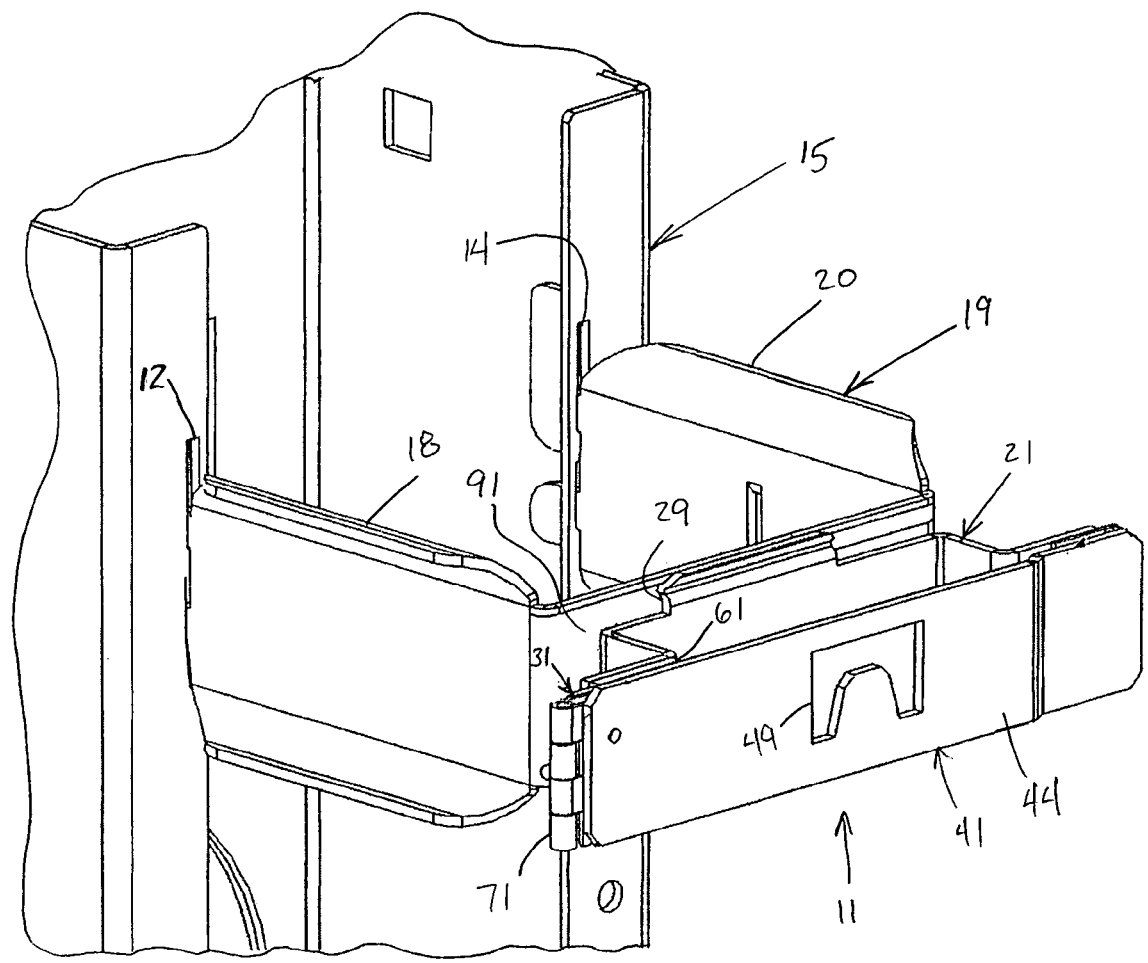
FIG. 7 is a front perspective view of a hinged swing bracket assembly attached to a channel.

The hinged swing bracket assembly 11 has first, second and third arms, as shown in FIGS. 5–7. The first arm 21 has a first end 23 and a second end 25 and is adapted to be connected to a support 15. The second arm 31 has a first end 33 and a second end 35. The first end 33 of the second arm 31 is pivotally connected to the second end 25 of the first arm 21 and the second end 35 of the second arm 31 is releasably connected to the first end 23 of the first arm 21. The third arm 41 has a first end 43 and a second end 45. The first end 43 of the third arm 41 is pivotally connected to the second end 35 of the second arm 31, and the second end 45 of the third arm 41 is releasably connected to the first end 33 of the second arm 31.

The hinged swing bracket assembly 11 of the present invention includes a first arm 21 adapted to be connected to a support 15 of a telecommunications rack system 13, as shown in FIGS. 1–4. The telecommunications rack system 13 is secured to a support 10, preferably a floor. Preferably, the support 15 is a channel member. A mounting bracket 19 may be connected to the support 15 to receive the hinged swing bracket assembly 11, such as the mounting bracket and channel member disclosed in U.S. Pat. No. 6,347,714 to Fournier et al., and which is hereby incorporated by reference in its entirety.

The first arm 21 has an inner surface 22 and an outer surface 24. A slot 27 is provided in the first arm 21 to receive a mounting member (not shown) of the support mounting bracket 19. A first mounting tab 29 is adapted to be received by mounting bracket 19 on the support 15 to reduce the amount of play.

The second arm 31 is pivotally and releasably connected to the first arm 21, as shown in FIGS. 5 and 6. Preferably, a first pivotal connection 51 and a second pivotal connection 61 are remotely disposed at opposite ends of the first and second arms. The second arm 31 has an inner surface 32 and an outer surface 34. A first pivotal connection 51 pivotally connects the first arm 21 to the second arm 31. Preferably, the first pivotal connection 51 is a first hinge. The first hinge 51 has first and second mounting surfaces 53 and 55, respectively. The first mounting surface 53 is connected to the inner surface 22 of the second end 25 of the first arm 21. The second mounting surface 55 is connected to the inner surface 32 of the first end 33 of the second arm 31. A first releasable connection 61 releasably connects the first and second arms 21 and 31, respectively. Preferably, the first releasable connection 61 is a first magnet. The first magnet 61 is disposed on the inner surface 22 of the first end 23 of the first arm 21. A first detent 37 is disposed on the inner surface 32 proximal the second end 35 of the second arm 31. An opening 63 in the first magnet receives the first detent 37 to releasably connect the first and second arms 21 and 31, respectively. Preferably, the first detent 37 is made of metal.

The third arm 41 is pivotally and releasably connected to the second arm 31, as shown in FIGS. 5 and 6. The third arm 41 has an inner surface 42 and an outer surface 44. Preferably, a second pivotal connection 71 and a second releasable connection 81 are remotely disposed at opposite ends of the second and third arms. A second pivotal connection 71 pivotally connects the second arm 31 to the third arm 41. Preferably, the second pivotal connection 71 is a second hinge. The second hinge 71 has first and second mounting surfaces 73 and 75, respectively. The first mounting surface 73 is connected to the outer surface 34 of the second end 35 of the second arm 31. The second mounting surface 75 is connected to the inner surface 42 of the first end 43 of the third arm 41. A second releasable connection 81 releasably connects the second and third arms 31 and 41, respectively. Preferably, the second releasable connection 81 is a second magnet. The second magnet 81 is disposed on the outer surface 34 of the first end 33 of the second arm 31. A second detent 47 is disposed on the inner surface 42 proximal the second end 45 of the third arm 41. An opening 83 in the second magnet 81 receives the second detent 37 to releasably connect the second and third arms 31 and 41, respectively. Preferably, the second detent 57 is made of metal.

A second mounting tab 49 is provided on the third arm 41, as shown in FIG. 6. Preferably, the second mounting tab 49 is disposed on the outer surface 44 of the third arm 41. The second mounting tab 49 is adapted to engage a corresponding mounting member disposed on an inner surface of the channel cover 17.

A telecommunications rack system 13 is shown in FIGS. 1–4. As shown, the telecommunications rack system 13 may have any number of channel members 15. The telecommunications rack system 13 shown in FIG. 1 has two channel members 15 and 15A. The telecommunications rack system 13 shown in FIG. 2 has three channel members 15, 15A and 15B. Electrical equipment is stored between channel members, with the cabling being managed within the open faces 16, 16A and 16B of each channel member 15, 15A and 15B.

A mounting bracket 19 is secured to the channel member 15, as shown in FIG. 7. Arms 18 and 20 of the mounting bracket 19 are received by slots 12 and 14 in the channel member 15 to secure the mounting bracket to the channel member 15. Preferably, a mounting bracket 19 is secured proximal each end of the channel member 15 to evenly distribute the weight of the cover 17.

Preferably, the first, second and third arms 21, 31 and 41 are made of metal. Preferably, the first and second detents 37 and 47 are made of metal.

Assembly and Disassembly

Figure 1:
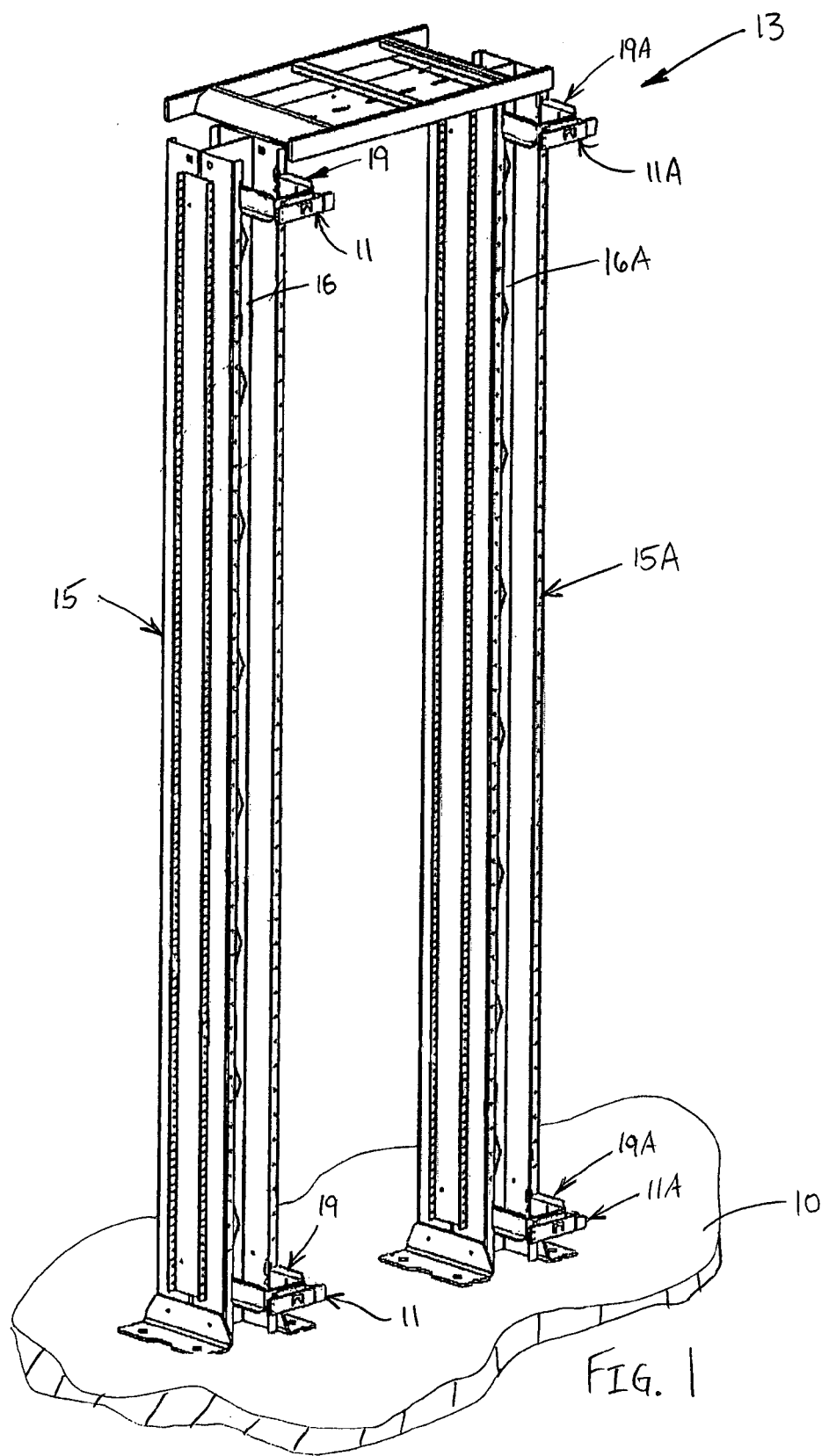
FIG. 1 is a perspective view of a telecommunications rack system having two channel members, each having a hinged swing bracket assembly according to the present invention connected thereto.
Figure 2:
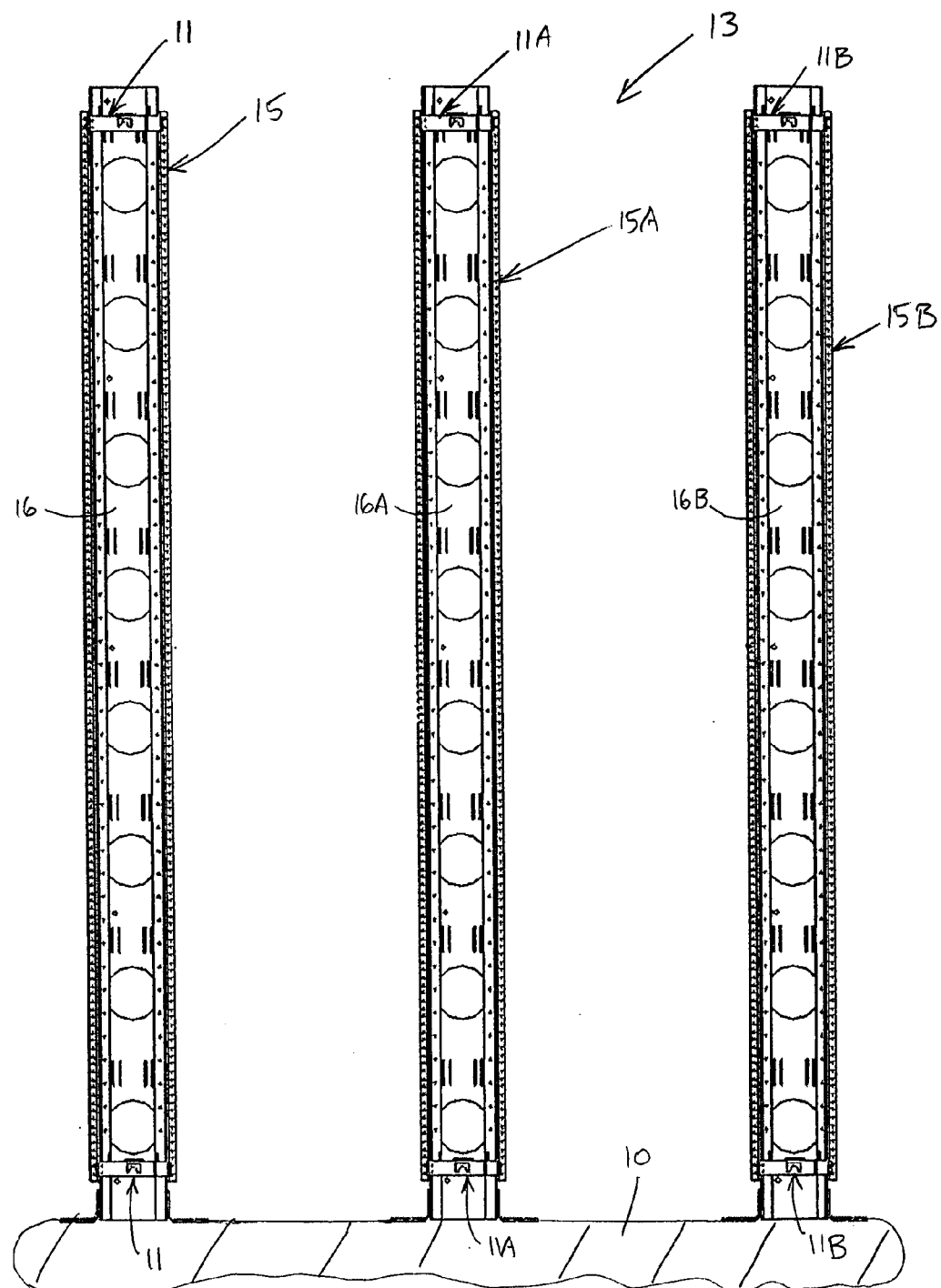
FIG. 2 is a front view of a telecommunications rack system having three channel members, each having a hinged swing bracket assembly according to the present invention connected thereto.
Figure 3:
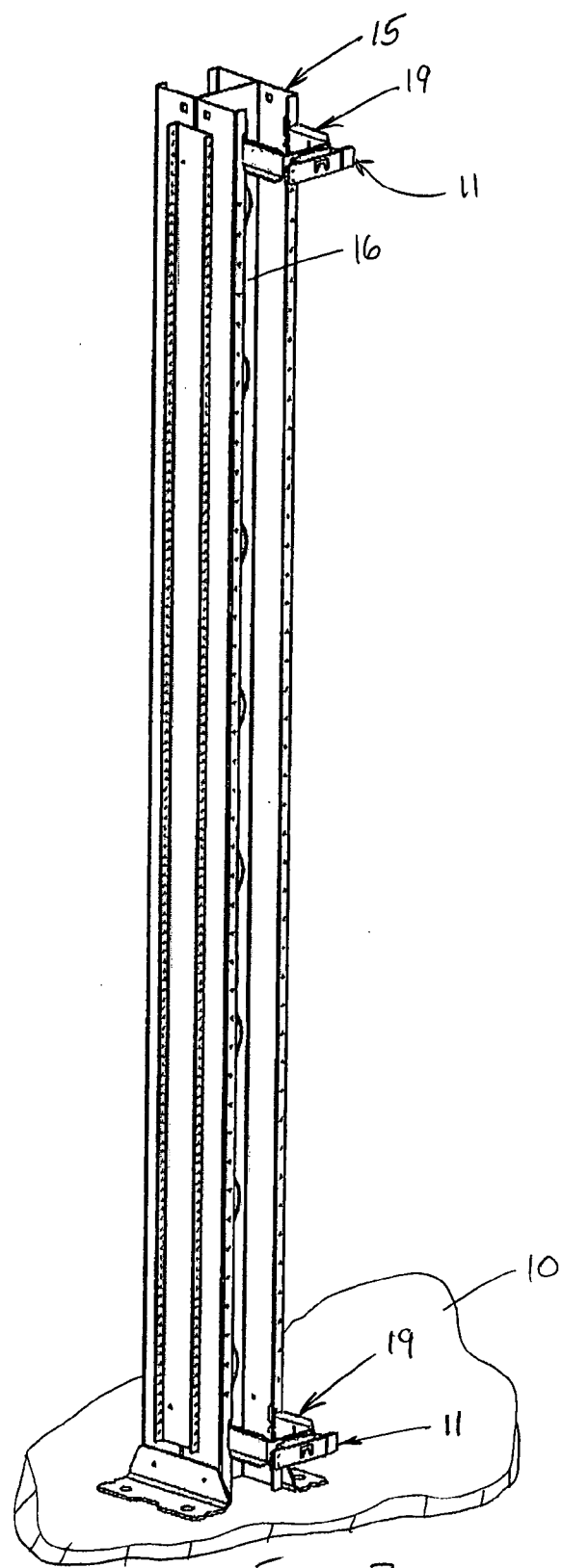
FIG. 3 is a perspective view of a channel member to which a hinged swing bracket assembly according to the present invention is connected.
Figure 4:
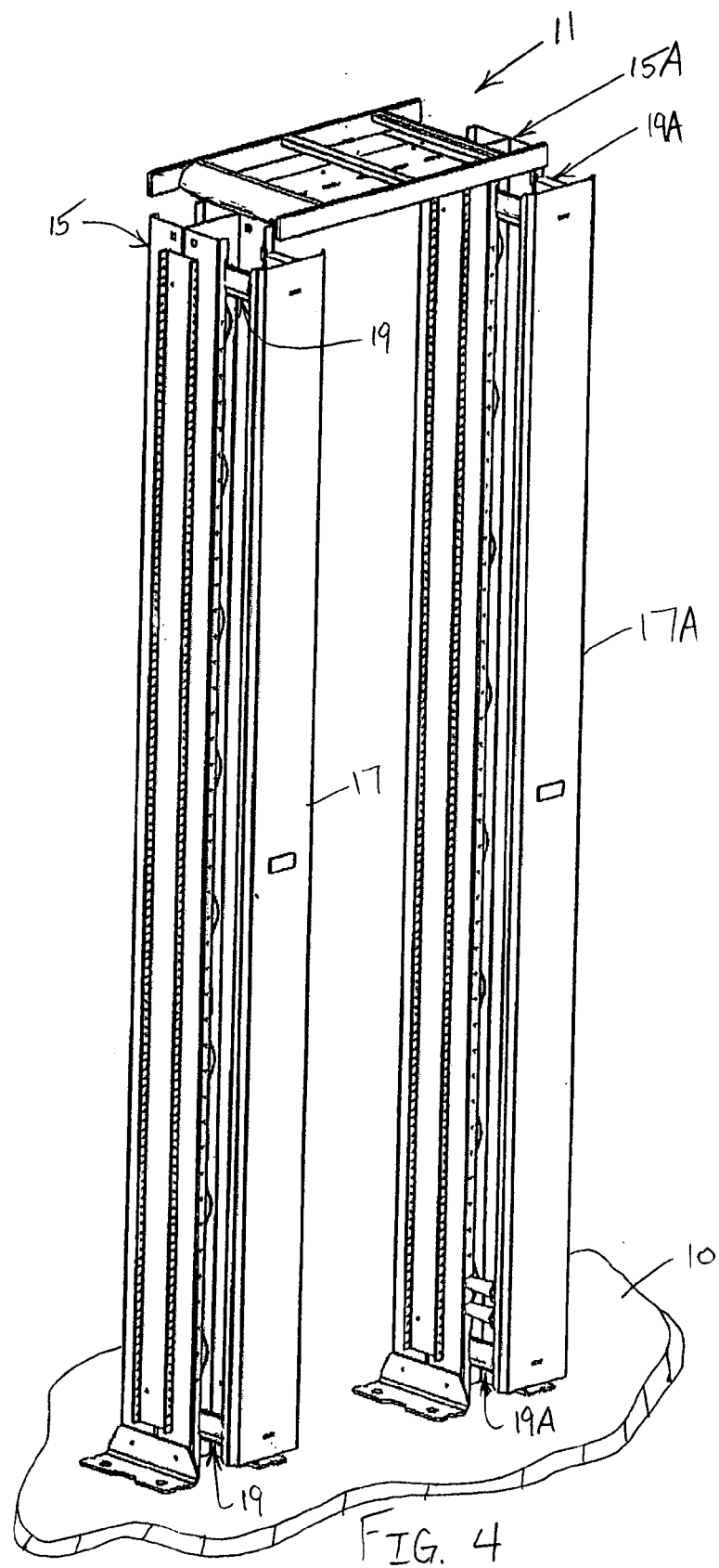
FIG. 4 is a perspective view of the telecommunications rack system of FIG. 1 to which covers have been secured to the hinged swing bracket assemblies according to the present invention.

As shown in FIGS. 1 and 7, the hinged swing bracket assembly 11 is fully constructed and connected to a channel member 15 of a telecommunications rack system 13, which is secured to the floor 10. As shown in FIG. 4, the cover 17 is connected to the hinged swing bracket assembly 11 to cover the cabling managed by the channel member 15.

Preferably, two mounting brackets 19 are secured to each channel member 15 of the telecommunications rack system 13, as shown in FIGS. 1–4. Mounting brackets 19 are secured to the first channel member 15, and mounting brackets 19A are secured to another channel member 15A, as shown in FIG. 4. The arms 18 and 20 of each mounting bracket 19 are received by slots 12 and 14 in the channel members 15, as shown in FIG. 7. Therefore, no tools or other hardware are required to secure the mounting brackets 19 to the channel members 15.

A hinged swing bracket assembly 11, 11A and 11B according to the present invention is secured to each mounting bracket 19, 19A and 19B, as shown in FIGS. 1–7. A channel cover 17, 17A is secured to each pair of hinged swing bracket assemblies 11, 11A, as shown in FIG. 4. The second mounting tab 49 on the third arm 41 receives a mounting member on an inner surface of the cover 17 to secure the cover to the hinged swing bracket assembly 11. Therefore, no tools or other hardware are required to secure the hinged swing bracket assemblies 11 to the mounting brackets 19 or to secure the channel covers 17 to the bracket assemblies 11.

Once secured to the hinged swing bracket assembly 11, the channel cover 17 may be pivotally opened in either a clockwise or counter clockwise direction. As shown in FIG. 5, the first releasable connection 61 may be broken to pivot the second arm 31 about the first pivotal connection 51 in a counterclockwise direction. As shown in FIG. 6, the second releasable connection 81 may be broken to pivot the third arm 41 about the second pivotal connection 71 in a clockwise direction. Therefore, the channel cover 17 may be opened in whichever direction is most convenient to access the cabling housed within the channel member 15 and without having to remove the channel cover from the channel member. Being able to open the cover 17 in either direction allows the same hinged swing bracket assembly 11 to be used for all applications, despite of the spacing limitations for the particular application.

The slot 27 in the first arm 31 of the hinged swing bracket assembly 11 receives a mounting member on the mounting bracket 19. First mounting tab 29 is received by the mounting bracket 19 to reduce the amount of play between the cover 17, bracket assembly 11, mounting bracket 19 and the channel member 15. Preferably, as shown in FIG. 7, the first mounting tab 29 is received by the outer surface 91 of the mounting bracket 19 so that the first mounting tab abuts the outer surface of the mounting bracket, thereby substantially eliminating movement between components.

The first pivotal connection 51 between the first arm 21 and the second arm 31 provides counterclockwise rotation of the second and third arms 31 and 41, as shown in FIG. 5. The second releasable connection 81 holds the second and third arms together during rotation about the first pivotal connection 51. The first releasable connection 61 between the first arm 21 and the second arm 31 is broken by pulling with sufficient force to overcome the connection, e.g., pulling with sufficient force to overcome the magnetic connection between the first and second arms 21 and 31. The cover may be closed by rotating the second and third arms in a clockwise direction about the first pivotal connection 51, so that the first detent 37 on the second arm 31 is received by the opening 63 in the first releasable connection 61, thereby securely closing the bracket assembly 11.

The second pivotal connection 71 between the second arm 31 and the third arm 41 provides clockwise rotation of the third arm, as shown in FIG. 6. The first releasable connection 61 holds the first and second arms 21 and 31 together during rotation about the second pivotal connection 71. The second releasable connection 81 between the second arm 31 and the third arm 41 is broken by pulling with sufficient force to overcome the connection, e.g., pulling with sufficient force to overcome the magnetic connection between the second and third arms 31 and 41. The cover may be closed by rotating the third arm 41 in a counterclockwise direction about the second pivotal connection 71, so that the second detent 47 on the third arm 41 is received by the opening 83 in the second releasable connection 81, thereby securely closing the bracket assembly 11.

While advantageous embodiments have been chosen to illustrate the invention, it will be understood by those skilled in the art that various changes and modifications may be made therein without departing from the scope of the invention as defined in the appended claims.

What is claimed is:

1. A hinged swing bracket assembly, comprising:
   a first arm adapted to be connected to a support;
   a second arm;
   a first pivotal connection to connect said second arm to said first arm;
   a third arm adapted to be connected to a cover;
   a second pivotal connection to connect said third arm to said second arm; and
   a first magnet disposed on an outer surface of said first arm at an end opposite to said first pivotal connection to releasably connect said second arm to said first arm.

2. A hinged swing bracket assembly according to claim 1, wherein
   said second arm is releasably connected to said first arm.

3. A hinged swing bracket assembly according to claim 1, wherein
   said third arm is releasably connected to said second arm.

4. A hinged swing bracket assembly according to claim 1, wherein
   a detent on said second arm is received by said first magnet.

5. A hinged swing bracket assembly according to claim 4, wherein
   said detent is made of metal.

6. A hinged swing bracket assembly according to claim 3, wherein
   a second magnet is disposed on an outer surface of said second arm to releasably connect said third arm to said second arm.

7. A hinged swing bracket assembly according to claim 6, wherein
a detent on said third arm is received by said second magnet.

8. A hinged swing bracket assembly according to claim 7, wherein
said detent is made of metal.

9. A hinged swing bracket assembly according to claim 1, wherein
a slot in said first arm receives a mounting member on the support to secure said hinged swing bracket assembly to the support.

10. A hinged swing bracket assembly according to claim 1, wherein
a mounting tab on said first arm is received by the support to secure said hinged swing bracket assembly to the support.

11. A hinged swing bracket assembly according to claim 1, wherein
said first pivotal connection between said first arm and said second arm is a hinge.

12. A hinged swing bracket assembly according to claim 1, wherein
said second pivotal connection between said second arm and said third arm is a hinge.

13. A hinged swing bracket assembly according to claim 1, wherein
a mounting tab on said third arm receives a cover.

14. A hinged swing bracket assembly according to claim 1, wherein
said first, second and third arms are made of metal.

* * * * *